(12) United States Patent
Chuang et al.

(10) Patent No.: US 12,500,145 B2
(45) Date of Patent: Dec. 16, 2025

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Min-Han Chuang, Taichung (TW); Ho-Chuan Lin, Taichung (TW); Chia-Chu Lai, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 396 days.

(21) Appl. No.: 18/341,529

(22) Filed: Jun. 26, 2023

(65) Prior Publication Data
US 2024/0290691 A1 Aug. 29, 2024

(30) Foreign Application Priority Data
Feb. 23, 2023 (TW) ................... 112106757

(51) Int. Cl.
| | |
|---|---|
| *H01L 23/02* | (2006.01) |
| *H01L 21/683* | (2006.01) |
| *H01L 23/00* | (2006.01) |
| *H01L 23/31* | (2006.01) |
| *H01L 23/48* | (2006.01) |
| *H01L 23/498* | (2006.01) |
| *H10D 1/20* | (2025.01) |

(52) U.S. Cl.
CPC ........ *H01L 23/481* (2013.01); *H01L 21/6835* (2013.01); *H01L 23/3128* (2013.01); *H01L 23/49816* (2013.01); *H01L 24/16* (2013.01); *H01L 24/48* (2013.01); *H10D 1/20* (2025.01); *H01L 2221/68345* (2013.01); *H01L 2224/16225* (2013.01); *H01L 2224/48227* (2013.01); *H01L 2924/19042* (2013.01)

(58) Field of Classification Search
CPC .............. H01L 23/481; H01L 21/6835; H01L 23/3128; H01L 23/49816; H01L 24/16; H01L 24/48; H01L 2221/68345; H01L 2224/16225; H01L 2224/48227; H01L 2924/19042; H01L 2224/04105; H01L 2224/12105; H01L 23/49822; H01L 23/5389; H10D 1/20
USPC ......................................... 257/678
See application file for complete search history.

(56) References Cited

U.S. PATENT DOCUMENTS

| | | | |
|---|---|---|---|
| 11,177,156 B2 * | 11/2021 | Yang ................. | H01L 24/05 |
| 2019/0139883 A1 * | 5/2019 | Gandhi .................... | H01C 1/02 |

\* cited by examiner

*Primary Examiner* — Theresa T Doan
(74) *Attorney, Agent, or Firm* — Studebaker Brackett PLLC

(57) ABSTRACT

An electronic package and a manufacturing method thereof are provided, in which a magnetically permeable member and a plurality of supporting members having conductive through vias are disposed on a carrier structure having a circuit layer, the magnetically permeable member is located between two supporting members, and a conductive member is disposed on the supporting members to cover the magnetically permeable member, so that the circuit layer, the conductive through vias and the conductive member form a coil surrounding the magnetically permeable member to increase the inductance.

20 Claims, 5 Drawing Sheets

ELECTRONIC PACKAGE AND MANUFACTURING METHOD THEREOF

BACKGROUND

1. Technical Field

The present disclosure relates to a semiconductor packaging process, and more particularly, to an electronic package with an inductive structure and a manufacturing method thereof.

2. Description of Related Art

With the vigorous development of the electronic industry, electronic products are gradually developing towards multifunctional and high-performance trends. In general semiconductor application devices, such as communication or high-frequency semiconductor devices, it is often necessary to electrically connect most radio-frequency passive elements such as resistors, inductors, capacitors and oscillators to the packaged semiconductor chip, so that the semiconductor chip has a specific current characteristic or emits a signal.

As shown in FIG. 1, in a conventional semiconductor package 1, a semiconductor chip 13 and a coil-type inductor 12 are disposed on a package substrate 10 having a circuit layer 11, and the semiconductor chip 13 is electrically connected to bonding pads 110 of the circuit layer 11 via a plurality of bonding wires 130.

However, the coil-type inductor 12 is disposed on the package substrate 10, so that the inductance generated by the coil-type inductor 12 is too small (about 17 nanohenries [nH]) and thus does not meet the requirements.

Therefore, how to overcome various problems of the above-mentioned prior art has become a difficult problem urgently to be overcome in the industry.

SUMMARY

In view of the above-mentioned deficiencies in the prior art, the present disclosure provides an electronic package, which comprises: a carrier structure having a circuit layer; a plurality of supporting members disposed on the carrier structure, wherein each of the supporting members has a first side and a second side opposing the first side, and each of the supporting members is disposed on the carrier structure via the first side, wherein each of the supporting members is configured with at least one conductive through via communicating with the first side and the second side, and the conductive through via is electrically connected to the circuit layer; a magnetically permeable member disposed on the carrier structure and located between two adjacent ones of the plurality of supporting members; and at least one conductive member disposed on the second side of each of the supporting members and covering the magnetically permeable member, wherein the circuit layer, the conductive through via and the conductive member form a coil surrounding the magnetically permeable member.

The present disclosure also provides a method of manufacturing an electronic package, the method comprises: providing a carrier structure having a circuit layer; disposing a plurality of supporting members on the carrier structure, wherein each of the supporting members has a first side and a second side opposing the first side, and each of the supporting members is disposed on the carrier structure via the first side, wherein each of the supporting members is configured with at least one conductive through via communicating with the first side and the second side, and the conductive through via is electrically connected to the circuit layer; disposing a magnetically permeable member on the carrier structure, wherein the magnetically permeable member is located between two adjacent ones of the plurality of supporting members; and disposing at least one conductive member on the second side of each of the supporting members to cover the magnetically permeable member, wherein the circuit layer, the conductive through via and the conductive member form a coil surrounding the magnetically permeable member.

In the aforementioned electronic package and method, each of the supporting members is made of a semiconductor bulk material.

In the aforementioned electronic package and method, the conductive through via is disposed on the circuit layer of the carrier structure via a conductive bump.

In the aforementioned electronic package and method, the magnetically permeable member is ferrite.

In the aforementioned electronic package and method, the magnetically permeable member has a width of at least greater than 500 micrometers.

In the aforementioned electronic package and method, the magnetically permeable member has a height of at least greater than 100 micrometers to 500 micrometers.

In the aforementioned electronic package and method, a surface of the magnetically permeable member is covered with an insulating layer.

In the aforementioned electronic package and method, the conductive member is a redistribution layer or a wire.

In the aforementioned electronic package and method, the present disclosure further comprises forming an encapsulation layer on the carrier structure to cover the supporting members, the magnetically permeable member and the conductive member. For example, the present disclosure further comprises forming a shielding structure on the encapsulation layer.

It can be seen from the above that the electronic package and the manufacturing method thereof according to the present disclosure adopt a configuration of the plurality of supporting members having the conductive through vias to facilitate the formation of a coil surrounding the magnetically permeable member, so that the magnetic field tends to concentrate on the magnetically permeable member, so as to increase the magnetic flux, thereby increasing the inductance. Therefore, compared with the prior art, the inductance of the electronic package of the present disclosure can be effectively improved, so as to prevent the electronic package from having the problem of too small inductance.

DETAILED DESCRIPTION

The following describes the implementation of the present disclosure with examples. Those skilled in the art can easily understand other advantages and effects of the present disclosure from the content disclosed in this specification.

It should be understood that, the structures, ratios, sizes, and the like in the accompanying figures are used for illustrative purposes to facilitate the perusal and comprehension of the content disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical content disclosed in the present specification. Meanwhile, terms such as "on," "upper," "a," "one" and the like are merely used for clear explanation rather than limiting the practicable scope of the present disclosure, and thus, alterations or adjustments of the relative relationships thereof without essentially altering the technical content should still be considered in the practicable scope of the present disclosure.

FIG. 2A to FIG. 2E are schematic cross-sectional views illustrating a manufacturing method of an electronic package 2 according to the present disclosure.

Figure 1:
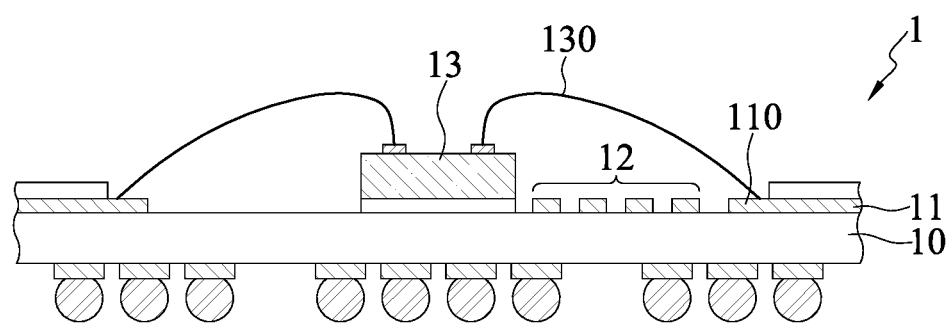
FIG. 1 is a schematic cross-sectional view of a conventional semiconductor package.
Figure 2A:
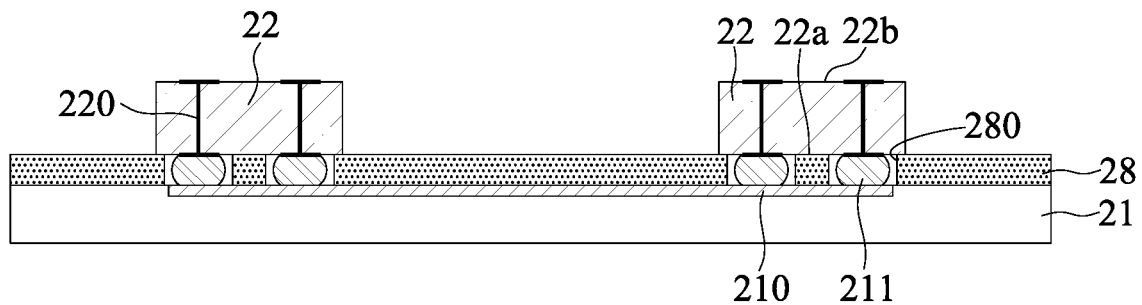
FIG. 2A to FIG. 2E are schematic cross-sectional views illustrating a manufacturing method of an electronic package according to the present disclosure.

As shown in FIG. 2A, a carrier structure 21 having a circuit layer 210 is provided, so that a plurality of supporting members 22 are disposed on the carrier structure 21, and the plurality of supporting members 22 are electrically connected to the circuit layer 210. In an embodiment, the carrier structure 21 is, for example, a package substrate having a core layer and a circuit structure, a package substrate having a coreless circuit structure, a through-silicon interposer (TSI) having through-silicon vias (TSVs), or other board types. For example, an insulating protection layer 28 such as a solder-resist layer can be formed on the carrier structure 21 according to requirements, and the insulating protection layer 28 has a plurality of openings to expose parts of a surface of the circuit layer 210. It should be understood that the carrier structure 21 may also be other types of chip-carrying board, such as a lead frame, a wafer, or other types of board having metal routings, and the like, and the present disclosure is not limited to as such.

Moreover, each of the supporting members 22 has a first side 22a and a second side 22b opposing the first side 22a, so that the supporting members 22 are disposed on the carrier structure 21 via their first side 22a. For example, the supporting members 22 are made of semiconductor bulk materials, such as passive elements in the form of dummy dies. At least one conductive through via 220 connecting the first side 22a and the second side 22b, such as a conductive through-silicon via (TSV), is disposed inside each of the supporting members 22, so that the at least one conductive through via 220 is exposed from an end of the first side 22a, and each of the supporting members 22 is disposed on the circuit layer 210 of the carrier structure 21 via a plurality of conductive bumps 211 such as solder material, metal pillars, or other conductors and is electrically connected to the circuit layer 210.

Figure 2B:
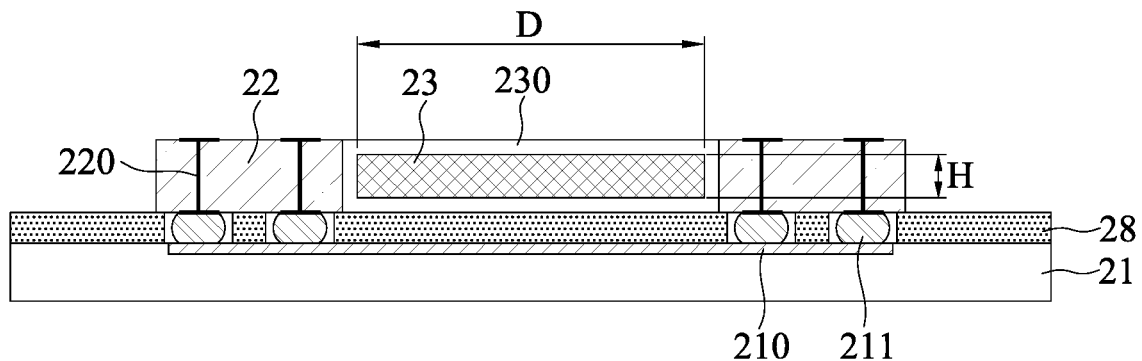

As shown in FIG. 2B, a magnetically permeable member 23 (e.g., a magnetically conductive member) is disposed on the carrier structure 21, so that the magnetically permeable member 23 is disposed between two adjacent ones of the plurality of supporting members 22.

In an embodiment, the magnetically permeable member 23 has the characteristics of high magnetic permeability, such as ferrite. For example, the magnetically permeable member 23 has a width D of at least greater than 500 micrometers (μm), and the magnetically permeable member 23 has a height H of at least greater than 100 micrometers to 500 micrometers.

Moreover, the surface of the magnetically permeable member 23 can be coated/covered with an insulating layer 230. For example, the insulating layer 230 contacts and abuts against the supporting members 22. Therefore, the configuration of the insulating layer 230 can further isolate the metal material (such as the conductive through via 220) adjacent to the magnetically permeable member 23.

Figure 2C:
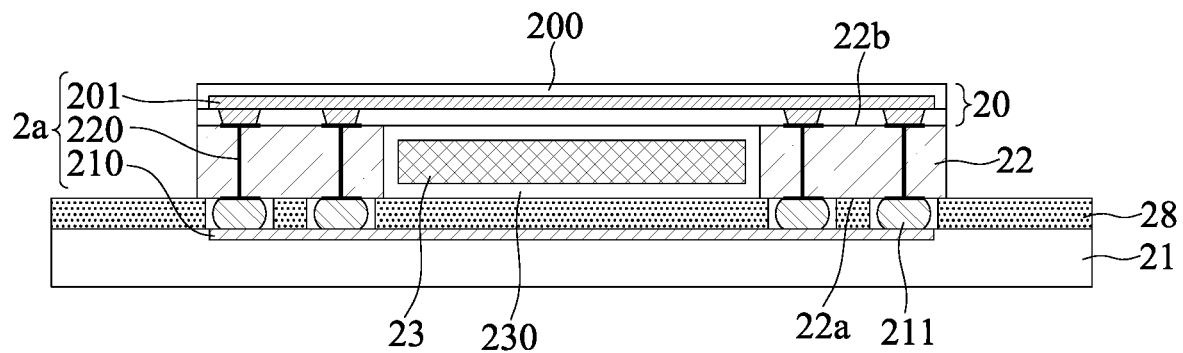

As shown in FIG. 2C, a conductive member 201 electrically connected to the conductive through vias 220 is formed on the second sides 22b of the supporting members 22, and the conductive member 201 covers the magnetically permeable member 23, so that the circuit layer 210, the conductive through vias 220 and the conductive member 201 form a coil 2a surrounding the magnetically permeable member 23.

In an embodiment, a redistribution layer (RDL) process is applied to the conductive member 201 to form a circuit structure 20 on the supporting members 22 and the magnetically permeable member 23, so that the conductive member 201 is bonded to a dielectric layer 200. For example, the material for forming the redistribution layer is copper, and the material for forming the dielectric layer 200 is polybenzoxazole (PBO), polyimide (PI), prepreg (PP), or other dielectric materials.

Figure 3A:
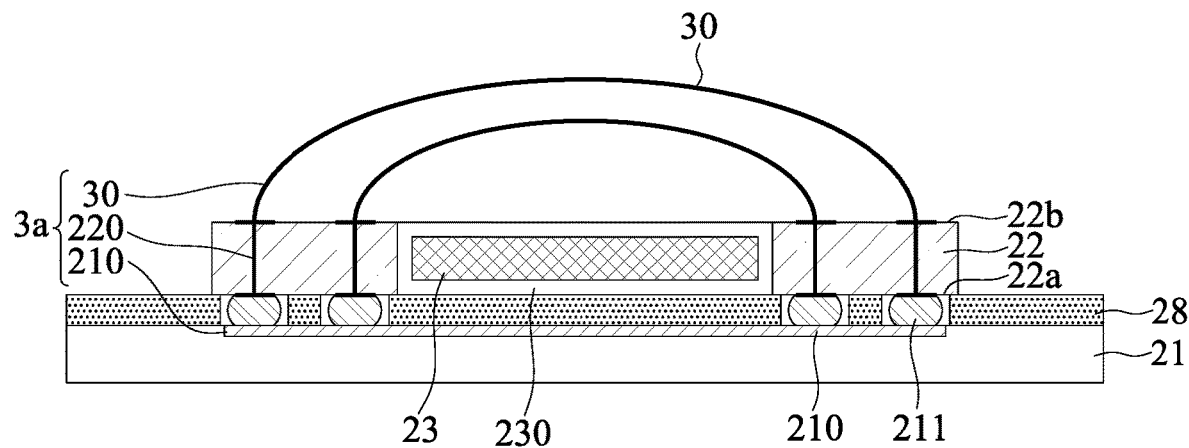
FIG. 3A to FIG. 3B are schematic cross-sectional views illustrating a manufacturing method of an electronic package according to another embodiment of the present disclosure.

Furthermore, in other embodiments, as shown in FIG. 3A, a coil 3a surrounding the magnetically permeable member 23 may use a wire instead of a redistribution layer as a conductive member 30. For example, the wire-type conductive member 30 is a bonding wire in a wire-bonding process, such as a gold wire, and opposite ends of the conductive member 30 are respectively connected to the conductive through vias 220 of the two supporting members 22.

Figure 2D:
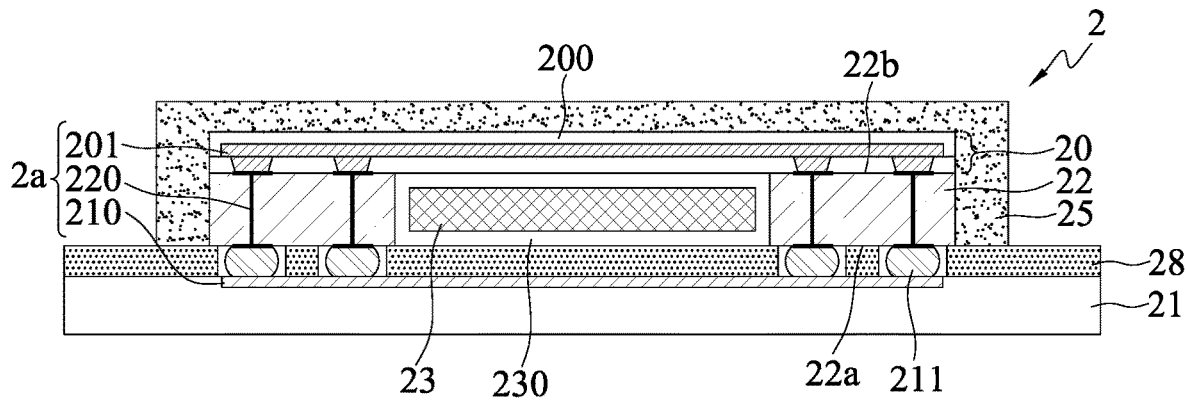

As shown in FIG. 2D, an encapsulation layer 25 is formed on the carrier structure 21, so that the encapsulation layer 25 covers the supporting members 22, the magnetically permeable member 23 and the conductive member 201 (the circuit structure 20).

In an embodiment, the encapsulation layer 25 is made of an insulating material, for example, an encapsulant such as epoxy resin, which can be formed on the carrier structure 21 by lamination or molding.

Figure 2E:
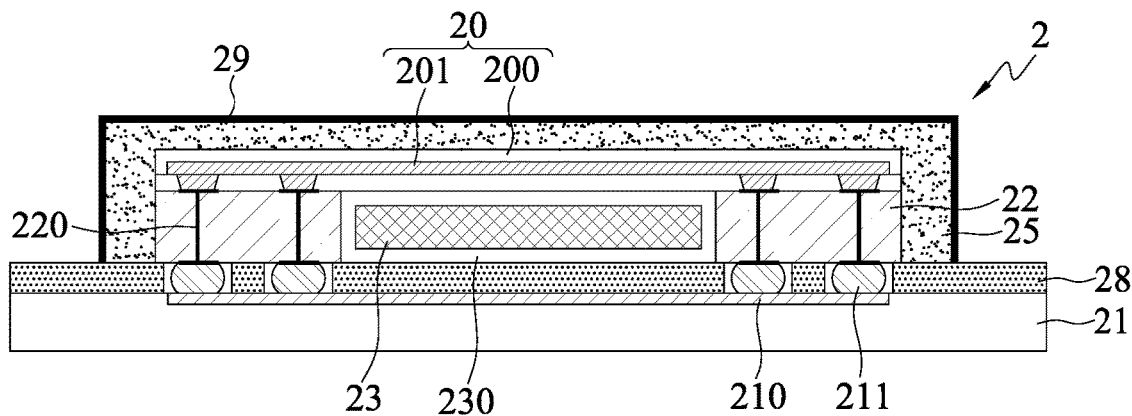

Furthermore, as shown in FIG. 2E, a shielding structure 29 may be formed on the surface of the encapsulation layer 25 in subsequent processes. For example, the shielding structure 29 can be composed of at least one metal layer, which can be fabricated by sputtering, evaporation, electroplating, electroless plating, or foiling to cover the encapsulation layer 25.

Figure 3B:
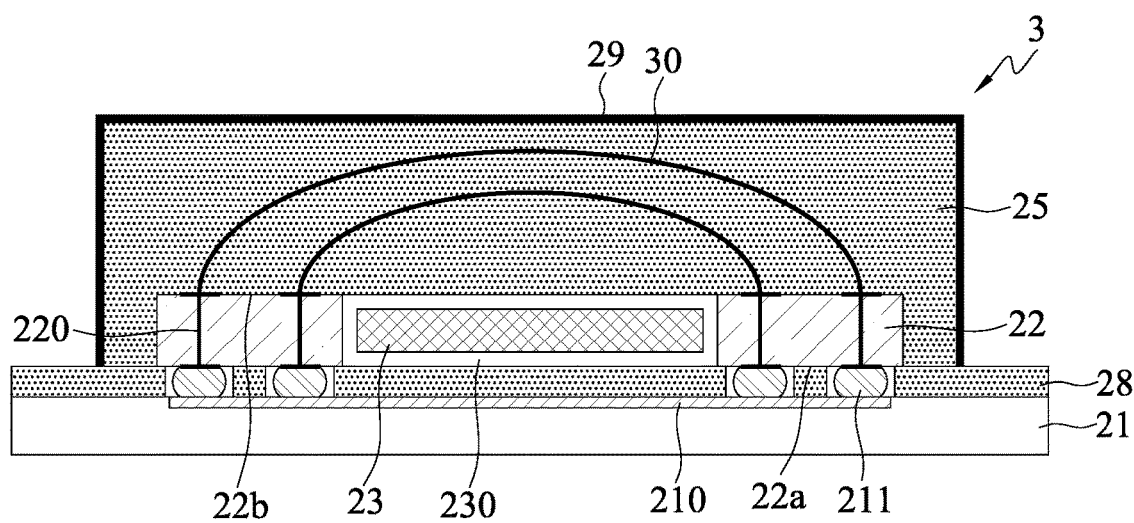

Also, if the coil 3a shown in FIG. 3A is used in the manufacturing process shown in FIG. 2C, an electronic package 3 shown in FIG. 3B will be obtained.

Therefore, in the manufacturing method of the electronic package 2, 3 of the present disclosure, a configuration of the plurality of supporting members 22 having the conductive through vias 220 is adopted, so that the carrier structure 21, the supporting members 22, the magnetically permeable member 23 and the conductive member 201, 30 form the required inductance, and the circuit layer 210, the conductive through vias 220 and the conductive member 201, 30 form the coil 2a, 3a surrounding the magnetically permeable member 23, such that the magnetic field tends to concentrate on a ferromagnetic path of low reluctance. Further, by designing the width of the magnetically permeable member 23 to be greater than 500 micrometers, the magnetic flux is increased, so as to increase the inductance without forming too many turns of the coil to cause the volume of the electronic package 2, 3 to be too large. Therefore, compared with the prior art, the inductance of the electronic package 2, 3 of the present disclosure can be effectively improved (such as reaching 75 nH, which is much greater than the 17 nH of the prior art), so as to prevent the electronic package 2, 3 from having problems of too small inductance and too large volume.

Figure 4:
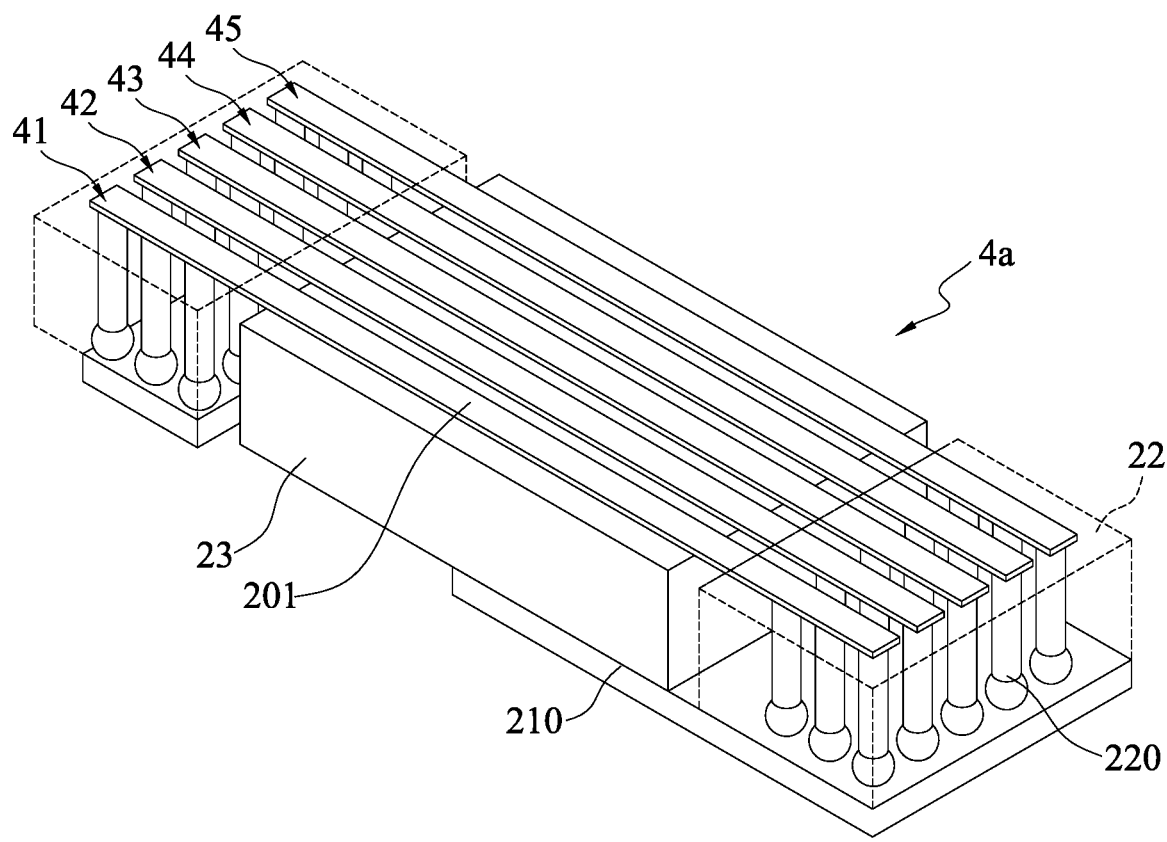
FIG. 4 is a partial perspective view showing another aspect of FIG. 2E.

In addition, the number of coils of the electronic package 2, 3 can be designed according to requirements. For instance, an inductive structure 4a shown in FIG. 4 has five coils 41, 42, 43, 44, 45 to generate a larger inductance in the same layout space.

The present disclosure also provides an electronic package 2, 3, comprising: a carrier structure 21 having a circuit layer 210, a plurality of supporting members 22 disposed on the carrier structure 21, at least one magnetically permeable member 23 disposed on the carrier structure 21, and at least one conductive member 201, 30 covering the magnetically permeable member 23.

Each of the supporting members 22 has a first side 22a and a second side 22b opposing the first side 22a, so that each of the supporting members 22 is disposed on the carrier structure 21 via the first side 22a thereof, and each of the supporting members 22 is configured with at least one conductive through via 220 communicating with the first side 22a and the second side 22b, so that the at least one conductive through via 220 is electrically connected to the circuit layer 210.

The magnetically permeable member 23 is located between two adjacent ones of the supporting members 22.

The conductive member 201, 30 is disposed on the second sides 22b of the supporting members 22 to cover the magnetically permeable member 23, wherein the circuit layer 210, the conductive through vias 220 and the conductive member 201, 30 form a coil 2a, 3a, 41, 42, 43, 44, 45 surrounding the magnetically permeable member 23.

In one embodiment, each of the supporting members 22 is made of a semiconductor bulk material.

In one embodiment, the conductive through vias 220 are disposed on the circuit layer 210 of the carrier structure 21 via conductive bumps 211.

In one embodiment, the magnetically permeable member 23 is ferrite.

In one embodiment, the magnetically permeable member 23 has a width D of at least greater than 500 micrometers.

In one embodiment, the magnetically permeable member 23 has a height H of at least greater than 100 micrometers to 500 micrometers.

In one embodiment, the surface of the magnetically permeable member 23 is covered with an insulating layer 230.

In one embodiment, the conductive member 201, 30 is a redistribution layer or a wire.

In one embodiment, the electronic package 2, 3 further includes an encapsulation layer 25 formed on the carrier structure 21, so that the encapsulation layer 25 covers the supporting members 22, the magnetically permeable member 23 and the conductive member 201, 30. Further, the electronic package 2, 3 may include a shielding structure 29 formed on the encapsulation layer 25.

To sum up, the electronic package and the manufacturing method thereof according to the present disclosure are designed to facilitate the formation of the required coil via the design of the magnetically permeable member, so that the coil surrounds the magnetically permeable member to increase the inductance. Therefore, the electronic package of the present disclosure can avoid the problems of too small inductance and too large volume.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:
   a carrier structure having a circuit layer;
   a plurality of supporting members disposed on the carrier structure, wherein each of the supporting members has a first side and a second side opposing the first side, and each of the supporting members is disposed on the carrier structure via the first side, wherein each of the supporting members is configured with at least one conductive through via communicating with the first side and the second side, and the conductive through via is electrically connected to the circuit layer;
   a magnetically permeable member disposed on the carrier structure and located between two adjacent ones of the plurality of supporting members; and
   at least one conductive member disposed on the second side of each of the supporting members and covering the magnetically permeable member, wherein the circuit layer, the conductive through via and the conductive member form a coil surrounding the magnetically permeable member.

2. The electronic package of claim 1, wherein each of the supporting members is made of a semiconductor bulk material.

3. The electronic package of claim 1, wherein the conductive through via is disposed on the circuit layer of the carrier structure via a conductive bump.

4. The electronic package of claim 1, wherein the magnetically permeable member is ferrite.

5. The electronic package of claim 1, wherein the magnetically permeable member has a width of at least greater than 500 micrometers.

6. The electronic package of claim 1, wherein the magnetically permeable member has a height of at least greater than 100 micrometers to 500 micrometers.

7. The electronic package of claim 1, wherein a surface of the magnetically permeable member is covered with an insulating layer.

8. The electronic package of claim 1, wherein the conductive member is a redistribution layer or a wire.

9. The electronic package of claim 1, further comprising an encapsulation layer formed on the carrier structure and covering the supporting members, the magnetically permeable member and the conductive member.

10. The electronic package of claim 9, further comprising a shielding structure formed on the encapsulation layer.

11. A method of manufacturing an electronic package, the method comprising:
    providing a carrier structure having a circuit layer;
    disposing a plurality of supporting members on the carrier structure, wherein each of the supporting members has a first side and a second side opposing the first side, and each of the supporting members is disposed on the carrier structure via the first side, wherein each of the supporting members is configured with at least one conductive through via communicating with the first side and the second side, and the conductive through via is electrically connected to the circuit layer;

disposing a magnetically permeable member on the carrier structure, wherein the magnetically permeable member is located between two adjacent ones of the plurality of supporting members; and disposing at least one conductive member on the second side of each of the supporting members to cover the magnetically permeable member, wherein the circuit layer, the conductive through via and the conductive member form a coil surrounding the magnetically permeable member.

12. The method of claim 11, wherein each of the supporting members is made of a semiconductor bulk material.

13. The method of claim 11, wherein the conductive through via is disposed on the circuit layer of the carrier structure via a conductive bump.

14. The method of claim 11, wherein the magnetically permeable member is ferrite.

15. The method of claim 11, wherein the magnetically permeable member has a width of at least greater than 500 micrometers.

16. The method of claim 11, wherein the magnetically permeable member has a height of at least greater than 100 micrometers to 500 micrometers.

17. The method of claim 11, wherein a surface of the magnetically permeable member is covered with an insulating layer.

18. The method of claim 11, wherein the conductive member is a redistribution layer or a wire.

19. The method of claim 11, further comprising forming an encapsulation layer on the carrier structure to cover the supporting members, the magnetically permeable member and the conductive member.

20. The method of claim 19, further comprising forming a shielding structure on the encapsulation layer.

* * * * *